(12) United States Patent
Takeguchi et al.

(10) Patent No.: US 7,754,541 B2
(45) Date of Patent: Jul. 13, 2010

(54) DISPLAY DEVICE AND METHOD OF PRODUCING THE SAME

(75) Inventors: Toru Takeguchi, Tokyo (JP); Takuji Imamura, Tokyo (JP); Kazushi Yamayoshi, Tokyo (JP); Tomoyuki Irizumi, Tokyo (JP); Atsunori Nishiura, Tokyo (JP); Kaoru Motonami, Tokyo (JP)

(73) Assignee: Mitsubishi Electric Corporation, Tokyo (JP)

(*) Notice: Subject to any disclaimer, the term of this patent is extended or adjusted under 35 U.S.C. 154(b) by 0 days.

(21) Appl. No.: 11/948,377

(22) Filed: Nov. 30, 2007

(65) Prior Publication Data

US 2008/0135909 A1  Jun. 12, 2008

(30) Foreign Application Priority Data

Dec. 7, 2006  (JP)  .............................. 2006-330528

(51) Int. Cl.
*H01L 21/00* (2006.01)

(52) U.S. Cl. ............................ 438/149; 257/57; 257/59; 257/66; 257/72; 257/E21.414; 438/158; 438/164; 438/166; 349/42; 349/43

(58) Field of Classification Search .................. 349/42, 349/43, 33, 38, 39, 41–48, 54; 257/57–61, 257/66–72, 88–93, 453, 749; 438/149–166, 438/180–185, 197, 238, 239, 608, 609, 222

See application file for complete search history.

(56) References Cited

U.S. PATENT DOCUMENTS 6,369,410 B1  4/2002  Yamazaki et al.

| 2003/0038594 A1* | 2/2003 | Seo et al. ..................... 313/506 |
| 2004/0263706 A1* | 12/2004 | Cho et al. ..................... 349/43 |
| 2006/0038932 A1* | 2/2006 | Murade ........................ 349/42 |
| 2007/0148831 A1 | 6/2007 | Nagata et al. |

FOREIGN PATENT DOCUMENTS

| JP | 10-177163 | 6/1998 |
| JP | 11038439 A * | 2/1999 |
| JP | 11-261076 | 9/1999 |
| JP | 2000-206566 | 7/2000 |
| JP | 2001-330857 | 11/2001 |
| JP | 2002-182244 | 6/2002 |
| JP | 2003-75870 | 3/2003 |
| JP | 2003-121878 | 4/2003 |
| JP | 2005-37741 | 2/2005 |

OTHER PUBLICATIONS

U.S. Appl. No. 11/946,309, filed Nov. 28, 2007, Yamayoshi.

* cited by examiner

*Primary Examiner*—N Drew Richards
*Assistant Examiner*—Kyoung Lee
(74) *Attorney, Agent, or Firm*—Oblon, Spivak, McClelland, Maier & Neustadt, L.L.P.

(57) ABSTRACT

In a thin film transistor using a polycrystalline semiconductor film, when a storage capacitor is formed, it is often that a polycrystalline semiconductor film is used also in one electrode of the capacity. In a display device having a storage capacitor and thin film transistor which have a polycrystalline semiconductor film, the storage capacitor exhibits a voltage dependency due to the semiconductor film, and hence a display failure is caused. In the display device of the invention, a metal conductive film 5 is stacked above a semiconductor layer 4d made of a polycrystalline semiconductor film which is used as a lower electrode of a storage capacitor 130.

13 Claims, 12 Drawing Sheets

DISPLAY DEVICE AND METHOD OF PRODUCING THE SAME

CROSS-REFERENCE TO RELATED APPLICATION

This application is based upon and claims the benefit of priority from Japanese Patent Application No. 2006-330528 filed on Dec. 7, 2006, the entire contents of which are incorporated herein by reference.

BACKGROUND OF THE INVENTION

1. Field

The present invention relates to a display device, and particularly to a structure of an active matrix display device comprising a thin film transistor and a storage capacitor, and also to a method of producing it.

2. Description of the Related Art

A liquid crystal display device (LCD) which is one of conventional usual thin panels is generally used as a monitor for a personal computer, that for a portable information terminal, and the like, while taking advantage of low power consumption, small size, and light weight. Recently, such a device is widely used in a TV set, and will replace a conventional cathode-ray tube. Also an electroluminescence EL display device in which a luminous body such as an EL element is employed in a pixel display portion is used as a next-generation panel device. In such an EL element, problems of an LCD such as restrictions of view angle and contrast and difficulty of followability of high-speed response to a motion picture can be solved, and features which an LCD does not have, such as the self-luminous type, wide view angle, high contrast, and high-speed response are advantageously used.

In a pixel region of such a display device, a switching element such as a thin film transistor (TFT) is formed. An example of frequently employed TFTs is a TFT having a MOS structure using a semiconductor film. As structures of TFTs, there are several kinds including the inverse staggered type and the top-gate type. Semiconductor films such as a silicon film are classified into types including an amorphous semiconductor film and a polycrystalline semiconductor film. The kinds and types are adequately selected in accordance with the use and performance of a display device. In a panel of a medium or large size, a thin film transistor using an amorphous semiconductor film (a-Si TFT) is used. By contrast, in a panel of a small size, it is often to use a polycrystalline semiconductor film which enables miniaturization of a TFT because the aperture ratio of a display region can be increased.

Namely, the use of a thin film transistor using a polycrystalline semiconductor film (LTPS-TFT) in a display region can reduce not only the capacity of a switching transistor in each pixel, but also the area of a storage capacitor connected to the drain side, whereby a liquid crystal display device of a high resolution and a high aperture ratio can be realized. When LTPS-TFTs are used in a circuit in the periphery of a display device in addition to a display region, the numbers of ICs and substrates on which ICs are mounted can be reduced, and the periphery of the display device can be simplified. Therefore, a highly reliable display device having a narrow frame can be realized. An LTPS-TFT plays a leading role in a high-resolution liquid crystal display device such as QVGA (pixel number: 240×320) or VGA (pixel number: 480×640) for a panel which is as small as that for a portable telephone.

As described above, an LTPS-TFT is largely superior in performance than an a-Si TFT, and its resolution is expected to be further advanced.

As a method of producing a polycrystalline semiconductor film that is to be used in an LTPS-TFT, a method is known in which an amorphous semiconductor film is first formed above a silicon oxide film or the like that is formed as a foundation film on a substrate, and thereafter the semiconductor film is irradiated with a laser beam to be formed as a polycrystalline film. Also a method is known in which a TFT is produced after such a polycrystalline semiconductor film is produced. Specifically, a gate insulating film made of a silicon oxide film is first formed on a polycrystalline semiconductor film formed on a substrate, and a gate electrode is formed. Thereafter, impurities such as phosphorus or boron are introduced into the polycrystalline semiconductor film via the gate insulating film with using the gate electrode as a mask. By this way, source/drain regions are formed. Then, an interlayer insulating film is formed so as to cover the gate electrode and the gate insulating film, and thereafter contact holes which reach the source/drain regions are opened in the interlayer insulating film and the gate insulating film. A metal film is formed on the interlayer insulating film, and patterned so that the metal film is connected to the source/drain regions through the contact holes, thereby forming source/drain electrodes (for example, see Patent References 1 and 2). Thereafter, a pixel electrode or a self-luminous element is formed to be connected to the drain electrode, with the result that an active matrix display device is formed.

As an LTPS-TFT, a TFT of the top-gate type which is described above is usually employed. In such a TFT, as a gate insulating film, a silicon oxide film is formed in a very thin thickness of about 100 nm to be sandwiched between a gate electrode and a polycrystalline semiconductor film, thereby forming a MOS structure. Since the thickness of the silicon oxide film is very small, there is a further advantage that, when the film is used also as a dielectric insulating film of a storage capacitor which is formed simultaneously with the TFT, the area of the storage capacitor can be reduced. In this case, the storage capacitor is formed in the following manner. First, impurities such as phosphorus or boron are introduced into the polycrystalline semiconductor film which is below the gate insulating film, to lower the resistance. Thereafter, a conductive film pattern is formed on the gate insulating film so as to be opposed to the polycrystalline semiconductor film in which the resistance is lowered, via the gate insulating film (for example, see Patent Reference 3).

With respect to a storage capacitor which is placed for each pixel in an active matrix display device, the structure in the case of an LTPS-TFT is largely different from that in the case of an a-Si TFT. In the case where a storage capacitor is formed simultaneously with an LTPS-TFT, the portion corresponding to the lower electrode is the polycrystalline semiconductor film in which the resistance is lowered, and that corresponding to the dielectric insulating film is the gate insulating film in which the thickness is very small. By contrast, in the case where a storage capacitor is formed simultaneously with an a-Si TFT, usually, a structure is employed in which metal films respectively used as gate and source wirings sandwich an insulating film having a thickness of about 300 to 700 nm. As described above, the required area of the storage capacitor in the case of an LTPS-TFT is smaller.

In the case of an LTPS-TFT, however, the portion constituting one of the electrodes of the storage capacitor is not a metal film, but a polycrystalline semiconductor film. Hence, there is a problem in which a resistance of the polycrystalline semiconductor film is high. Usually, the resistance is lowered by introducing impurities such as phosphorus. Even when this process is performed, the resistance can be lowered at the most to only several kΩ/□ in the term of a sheet resistance conversion. Therefore, a large problem arises when, for example, a wiring is drawn from the TFT to the storage capacitor. Furthermore, a voltage dependency due to the property of the semiconductor possessed by the polycrystalline semiconductor film itself is produced. Consequently, there is a further problem in that a desired capacitance corresponding to the thickness of the insulating film cannot be obtained, and the display quality of the active matrix display device is lowered. In order to solve these problems, for example, it may be contemplated to employ a technique in which a conductive film made of a metal or the like is formed below the polycrystalline semiconductor film. In the crystallization of a semiconductor film by a high-temperature treatment using a laser beam or the like, however, the conductive film adversely affects the crystallization, and a polycrystalline semiconductor film of the high quality cannot be obtained. In the view of this point, the technique is not practical (for example, see Patent Reference 4).

[Patent Reference 1] JP-A-2003-75870 (FIG. 1)
[Patent Reference 2] JP-A-H11-261076 (FIG. 1)
[Patent Reference 3] JP-A-2000-206566 (FIG. 1)
[Patent Reference 4] JP-A-H10-177163 (FIG. 10)

SUMMARY OF THE INVENTION

The invention has been conducted in order to solve above-discussed problems. It is an object of the invention to, in a display device comprising a storage capacitor having a semiconductor film, and a thin film transistor, form the storage capacitor so that it does not depend on the voltage, without adversely affecting a high-temperature treatment on the semiconductor film, thereby improving the display quality of the display device.

The display device of the invention is characterized in that a conductive film is stacked above a polycrystalline semiconductor film which has been conventionally used as a lower electrode of a storage capacitor.

In the display device of the invention, the conductive film is stacked above the polycrystalline semiconductor film which is a lower electrode of the storage capacitor. Therefore, a desired capacitance corresponding to the thickness of the insulating film can be obtained, and the display quality of the display device can be improved.

DETAILED DESCRIPTION OF THE PREFERRED EMBODIMENT

Embodiment 1

Figure 1:
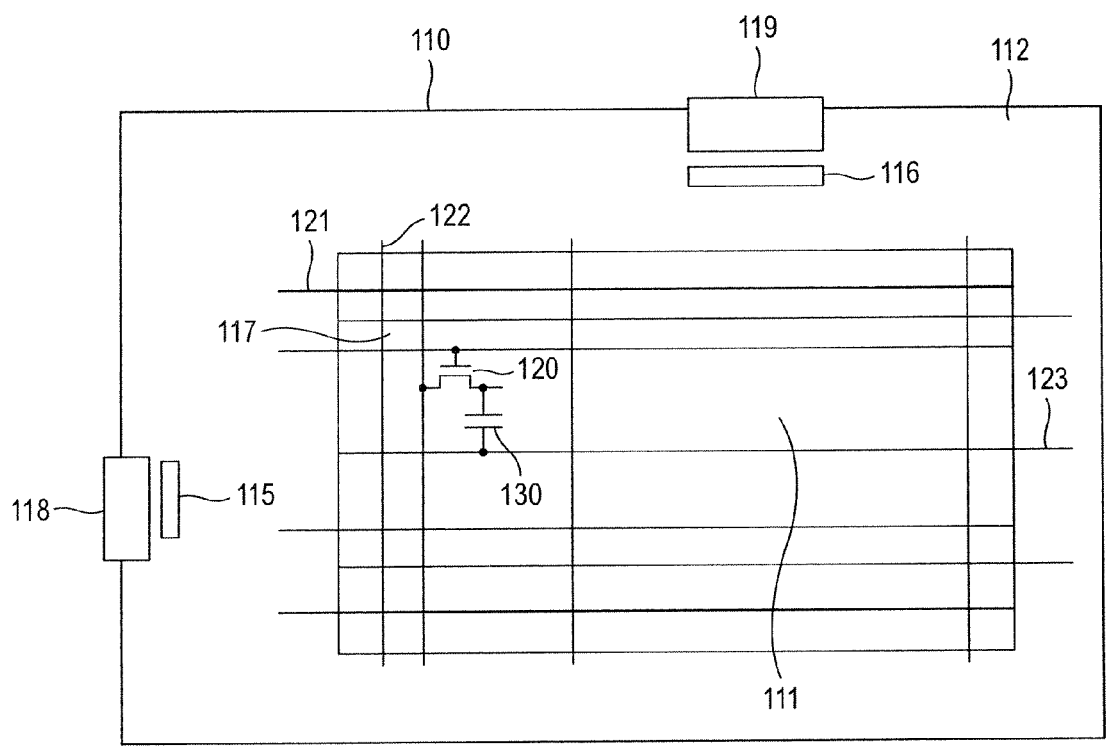
FIG. 1 is a plan view showing the configuration of a TFT substrate constituting a display device.

First, a TFT substrate constituting the display device of the invention will be described. FIG. 1 is a front view showing the configuration of a TFT substrate used in the display device. As the display device of the invention, a liquid crystal display device will be exemplarily described. However, this is for illustrative purpose only. Alternatively, for example, a flat panel display device such as an organic EL display device may be used.

The display device of the invention has the TFT substrate 110. For example, the TFT substrate 110 is a TFT array substrate. In the TFT substrate 110, a display region 111, and a frame region 112 which surrounds the display region 111 are disposed. In the display region 111, plural gate wirings (scan signal lines) 121 and plural source wirings (display signal lines) 122 are formed. The plural gate wirings 121 are disposed in parallel to one another. Similarly, the plural source wirings 122 are disposed in parallel to one another. The gate wirings 121 and the source wirings 122 are formed so as to intersect with one another. The gate wirings 121 and the source wirings 122 are orthogonal to one another. A region surrounded by gate and source wiring 121, 122 which are adjacent to each other functions as a pixel 117. In the TFT substrate 110, therefore, the pixels 117 are arranged in a matrix form. Storage capacity wirings 123 which cross the pixels 117 are formed in parallel to the gate wirings 121.

Moreover, a scan signal driving circuit 115 and a display signal driving circuit 116 are disposed in the frame region 112 of the TFT substrate 110. The gate wirings 121 are extended from the display region 111 to the frame region 112. In an end portion of the TFT substrate 110, the gate wirings 121 are connected to the scan signal driving circuit 115. Similarly, the source wirings 122 are extended from the display region 111 to the frame region 112. In an end portion of the TFT substrate 110, the source wirings 122 are connected to the display signal driving circuit 116. External wirings 118 are connected to the vicinity of the scan signal driving circuit 115, and external wirings 119 are connected to the vicinity of the display signal driving circuit 116. For example, the external wirings 118, 119 are configured by wiring substrates such as FPCs (Flexible Printed Circuits).

Various external signals are supplied to the scan signal driving circuit 115 and the display signal driving circuit 116 via the external wirings 118, 119. Based on an external control signal, the scan signal driving circuit 115 supplies a gate signal (scan signal) to the gate wirings 121. In response to the gate signal, the gate wirings 121 are sequentially selected. Based on an external control signal and/or display data, the display signal driving circuit 116 supplies a display signal to the source wirings 122. As a result, display voltages corresponding to the display data can be supplied to the pixels 117, respectively.

In each pixel 117, at least one TFT 120, and a storage capacitor 130 which is connected to the TFT 120 are formed. The TFT 120 is placed in the vicinity of the intersection of the source wiring 122 and the gate wiring 121. For example, the TFT 120 supplies the display voltage to the pixel electrode. In response to the gate signal supplied through the gate wiring 121, the TFT 120 which is a switching element is turned on. This causes the display voltage to be applied from the source wiring 122 to the pixel electrode connected to the drain electrode of the TFT. An electric field corresponding to the display voltage is produced between the pixel electrode and the opposing electrode. The storage capacitor 130 is electrically connected not only to the TFT 120, but also to the opposing electrode via the storage capacity wiring 123. Therefore, the storage capacitor 130 is connected in parallel to the capacity between the pixel electrode and the opposing electrode. An orientation film (not shown) is formed on the surface of the TFT substrate 110.

An opposing substrate is opposed to the TFT substrate 110. For example, the opposing substrate is a color filter substrate, and placed on the viewing side. A color filter, a black matrix (BM), the opposing electrode, an orientation film, and the like are formed on the opposing substrate. Sometimes, the opposing electrode may be placed on the side of the TFT substrate 110. A liquid crystal layer is interposed between the TFT substrate 110 and the opposing substrate. Namely, a liquid crystal exists between the TFT substrate 110 and the opposing substrate. A polarization plate, a phase difference plate, and the like are disposed on the outside faces of the TFT substrate 110 and the opposing substrate. A backlight unit or the like is disposed on the opposite viewing side of the liquid crystal display panel.

By the electric field between the pixel electrode and the opposing electrode, the liquid crystal is driven, i.e., the orientation direction of the liquid crystal between the substrates is changed. As a result, the polarization state of light passing through the liquid crystal layer is changed. Namely, the polarization state of light which passes through the polarization plate to be linearly polarized is changed by the liquid crystal layer. Specifically, light from the backlight unit is converted to linearly polarized light by the polarization plate on the side of the array substrate. When the linearly polarized light passes through the liquid crystal layer, the polarization state of the light is changed.

In accordance with the polarization state, the amount of light which passes through the polarization plate on the side of the opposing substrate is changed. Namely, among the transmitted light which is transmitted from the backlight unit through the liquid crystal display panel, the amount of light which passes through the polarization plate on the viewing side is changed in amount. The orientation direction of the liquid crystal is changed by the applied display voltage. By controlling the display voltage, therefore, the amount of light which passes through the polarization plate on the viewing side can be changed. When the display voltages for the respective pixels are varied, it is possible to display a desired image. In the series of operations, an electric field which is parallel to the electric field between the pixel electrode and the opposing substrate is formed in the storage capacitor 130, thereby contributing to holding of the display voltage.

Figure 2:
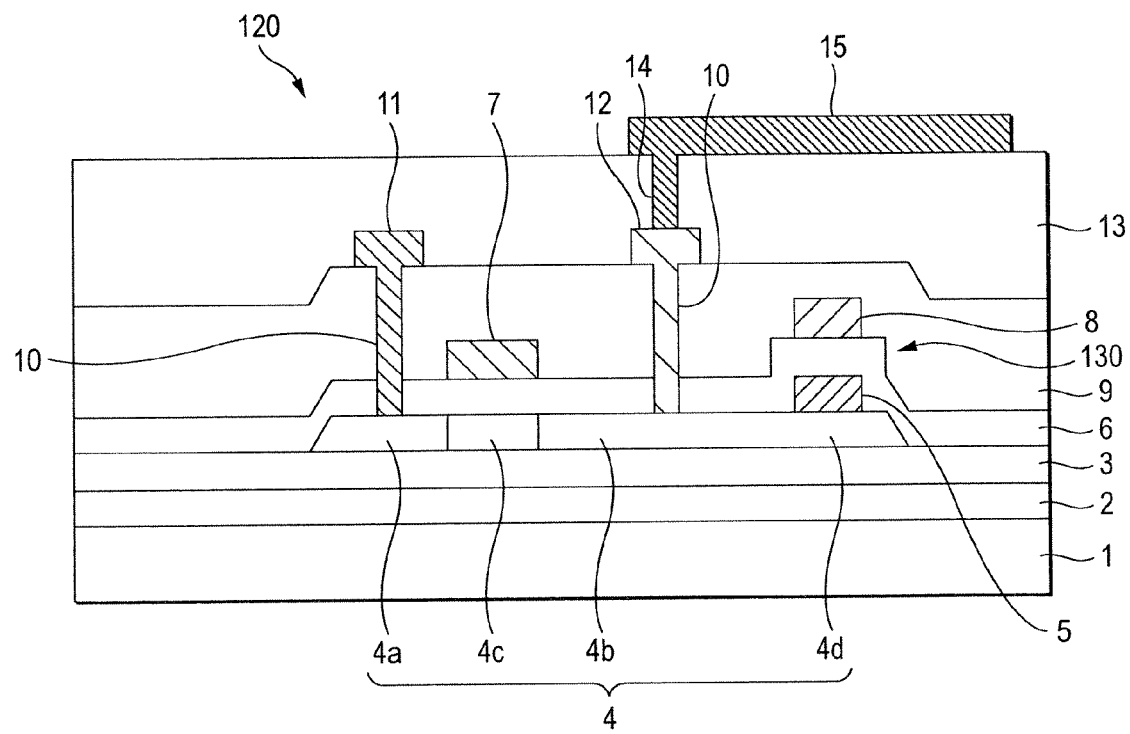
FIG. 2 is a sectional view showing configurations of a TFT and a storage capacitor constituting the display device of Embodiment 1.

Next, the configurations of the TFT 120 and storage capacitor 130 which are disposed on the TFT substrate 110 will be described with reference to FIG. 2. FIG. 2 is a sectional view of the TFT 120 and the storage capacitor 130 in the display device of Embodiment 1. A semiconductor layer 4 configured by polysilicon and the like is formed on a SiN film 2 and an $SiO_2$ film 3 on a glass substrate 1 which is an insulative substrate. The semiconductor layer 4 has a source region 4a, a channel region 4c, and a drain region 4b in the TFT 120, and a storage capacitor lower portion 4d in the storage capacitor 130. Impurities are introduced in the source region 4a and the drain region 4b, so that the regions are lower in resistance than the channel region 4c. A conductive film 5 is formed on the storage capacitor lower portion 4d. The stacked structure of the storage capacitor lower portion 4d and the conductive film 5 functions as a lower electrode of the storage capacitor 130. Although the boundary between the storage capacitor lower portion 4d and the drain region 4b is not illustrated in FIG. 2, the following description is made while assuming that the storage capacitor lower portion 4d corresponds to a lower portion of the conductive film 5. Next, a gate insulating film 6 made of $SiO_2$ is formed so as to cover the semiconductor layer 4, the conductive film 5, and the $SiO_2$ film 3. A gate electrode 7 is formed above the gate insulating film 6 so as to be opposed to the channel region 4c which is a part of the semiconductor layer 4, and an upper electrode 8 of the storage capacitor is formed so as to be opposed to the conductive film 5. The storage capacitor 130 is configured by the stacked structure of the semiconductor layer 4 and the conductive film 5, the upper electrode 8 of the storage capacitor, and the gate insulating film 6 functioning as a dielectric insulating film.

First contact holes 10 are opened in the gate insulating film 6, and a first interlayer insulating film 9 which is formed so as to cover the gate electrode 7 and the upper electrode 8 of the storage capacitor. A source electrode 11 and drain electrode 12 which are on the first interlayer insulating film 9 are connected to the source region 4a and the drain region 4b through the first contact holes 10, respectively. The source electrode 11 may be formed integrally with the source wiring 122. A second contact hole 14 is opened in a second interlayer insulating film 13 which is formed so as to cover the source electrode 11 and the drain electrode 12. A pixel electrode 15 formed on the second interlayer insulating film 13, and the drain electrode 12 are connected to each other through the second contact hole 14. Although not illustrated, a voltage is applied through the pixel electrode 15 to an electrooptic material such as a liquid crystal or a self-luminous material, thereby performing a display. In this way, also the conductive film which has a low resistance is caused to function as the lower electrode of the storage capacitor, whereby a desired voltage can be surely applied to the lower electrode. Therefore, an effect that a stable capacity can be formed is accomplished. When the thus completed TFT substrate 110 is used, it is possible to form a storage capacitor which does not depend on the voltage. Therefore, a display device which has a desired capacitance corresponding to the thickness of an insulating film, and in which less initial failures are caused can be obtained.

Figure 3A:
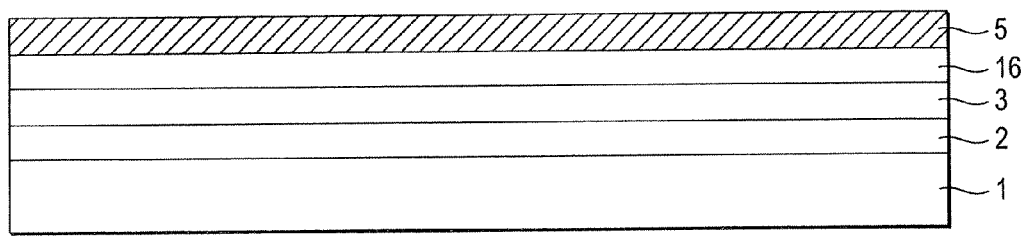
FIG. 3A, FIG. 3B and FIG. 3C are sectional views of a production step showing a method of producing the TFT and the storage capacitor constituting the display device of Embodiment 1.

Next, a method of producing the TFT substrate of the display device of Embodiment 1 will be described with reference to FIGS. 3 to 7. FIGS. 3 to 7 are step sectional views showing process steps with respect to the sectional view of FIG. 2. Referring to FIG. 3A, first, the SiN film 2 and SiO$_2$ film 3, which are light transmitting insulating films, are formed on the glass substrate 1 with the CVD method, as foundation films for the semiconductor layer 4. The glass substrate 1 is an insulative substrate that is made of a light transmitting material such as glass or quartz. In the embodiment, a stacked layer structure is grown in which a SiN film is formed in the thickness of 40 to 60 nm on a glass substrate, and a SiO$_2$ film is further grown in the thickness of 180 to 220 nm. The foundation films are disposed in order to prevent mobile ions which are caused mainly from the glass substrate 1, such as Na from diffusing into the semiconductor layer 4. The film configuration and the film thickness are not restricted to the above-mentioned ones.

An amorphous semiconductor film is formed on the foundation films by the CVD method. In the embodiment, a silicon film is used as the amorphous semiconductor film. The silicon film is grown into a thickness of 30 to 100 nm, preferably 60 to 80 nm. Preferably, the foundation films and the amorphous semiconductor film are continuously grown in the same apparatus or the same chamber. According to this way, contaminants existing in the air atmosphere such as boron can be prevented from being captured in the interfaces of the films. Preferably, an annealing process is performed at a high temperature after the growth of the amorphous semiconductor film. This is conducted in order to reduce hydrogen which is contained in a large amount in the amorphous semiconductor film grown by the CVD method. In the embodiment, the interior of a chamber, which was maintained to a low vacuum state in a nitrogen atmosphere, was heated to about 480° C. And the substrate on which the amorphous semiconductor film was formed was held in the chamber for 45 minutes. According to this process, even when the temperature is raised in crystallization of the amorphous semiconductor film, radical desorption of hydrogen does not occur, and surface roughness which may be caused after crystallization of the amorphous semiconductor film can be suppressed.

Then, a native oxide film formed on the surface of the amorphous semiconductor film is etched away by hydrofluoric acid or the like. Next, while blowing a gas such as nitrogen against the amorphous semiconductor film, the amorphous semiconductor film is irradiated with a laser beam from the upper side. The laser beam is passed through a predetermined optical system to be converted to a linear beam, and then the laser beam is irradiated to the amorphous semiconductor film. In the embodiment, the second harmonic (oscillation wavelength: 532 nm) of a YAG laser was used as the laser beam. Alternatively, an excimer laser may be used in place of the second harmonic of a YAG laser. The height of bulges which are produced in the crystal grain boundary can be suppressed by irradiating the amorphous semiconductor film with the laser beam while blowing nitrogen. In this way, an amorphous semiconductor film 16 which will be processed to the semiconductor layer 4 is formed.

Next, the conductive film 5 for forming the lower electrode of the storage capacitor forming region is grown. The conductive film 5 may be a film of Cr, Mo, W, or Ta, or an alloy film essentially containing such a metal. In the embodiment, a Mo film was formed at a thickness of about 20 nm by the DC magnetron sputtering method. Although the thickness of the conductive film 5 was set to 20 nm, the thickness is requested not to be larger than 25 nm. When the thickness of the conductive film 5 is 25 nm or less, ion impurities can reach the semiconductor layer 4 which is below the film, in an impurity ion doping process which is subsequently performed. Consequently, there is an advantage that an excellent ohmic contact can be obtained between the conductive film 5 and the semiconductor layer 4.

Figure 3B:
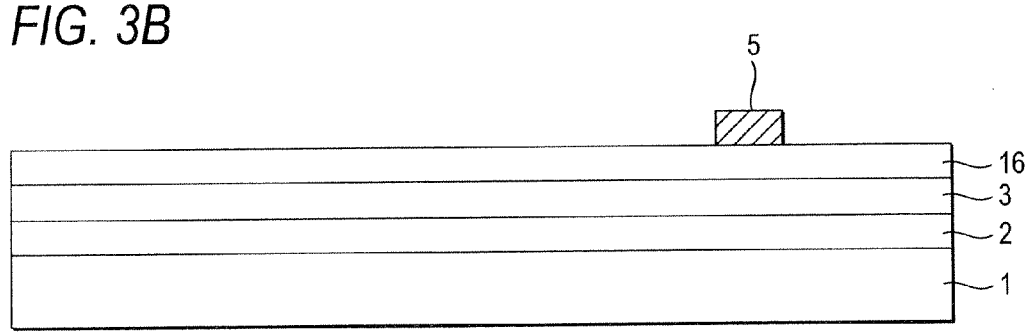

Next, a photoresist 17 which is a photosensitive resin was applied by the spin coat method onto the formed conductive film 5, and the applied photoresist 17 was subjected to exposing and developing processes by a known photoetching process. As a result, the photoresist 17 is patterned into a desired pattern. The etching process on the conductive film 5 was performed by a wet etching method using a chemical solution in which nitric and phosphoric acids are mixed with each other. As a result, the conductive film 5 is patterned as shown in FIG. 3B. The conductive film 5 is formed on the storage capacitor lower portion 4d as shown in FIG. 2.

Figure 3C:
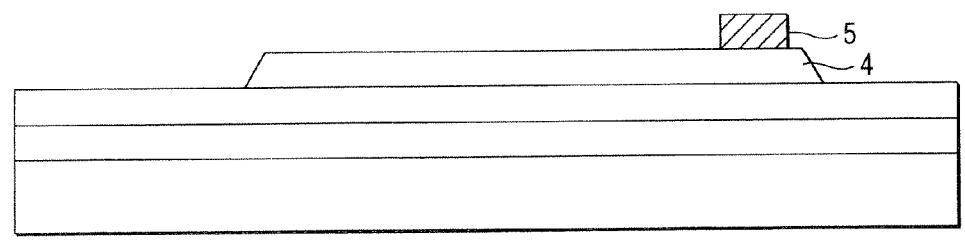

Next, referring to FIG. 3C, the amorphous semiconductor film 16 was patterned into a desired pattern by using a known photoetching process, and the semiconductor layer 4 was formed. In the embodiment, the semiconductor layer 4 was processed into a land-like shape by a dry etching method using a mixture gas of CF$_4$ and O$_2$. Since O$_2$ is mixed in the etching gas, the etching process can be performed while withdrawing the photoresist 17 formed by the photoetching process. Therefore, the semiconductor layer 4 can have a structure where a tapered shape is formed in an end portion.

When a known halftone mask is used in the pattering process of the amorphous semiconductor film 16 and the conductive film 5 which is contacted thereon, the formation can be conducted by one photoetching process. Namely, a photoresist in the portion where the amorphous semiconductor film is formed is half exposed to form a reduced thickness, and a photoresist in the portion of the shape of the conductive film is formed in a large thickness. The conductive film and the amorphous semiconductor film are patterned by using such a photoresist pattern. Next, the photoresist in the portion where the thickness is previously reduced is removed away by an ashing process, so that only the photoresist pattern in the desired conductive film pattern remains. Then, the conductive film is again subjected to a patterning process by using the remaining photoresist pattern.

Figure 4A:
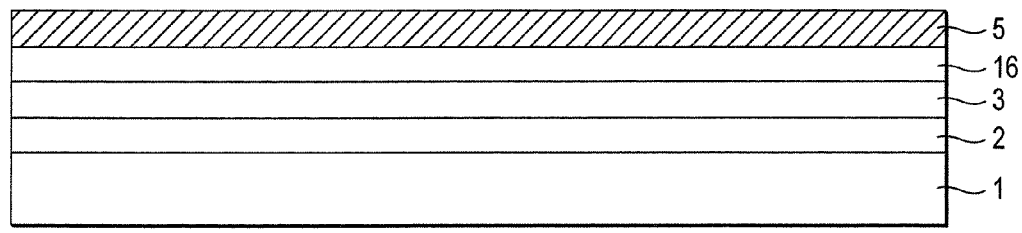
FIG. 4A, FIG. 4B and FIG. 4C are sectional views of a production step showing the method of producing the TFT and the storage capacitor constituting the display device of Embodiment 1.
Figure 4B:
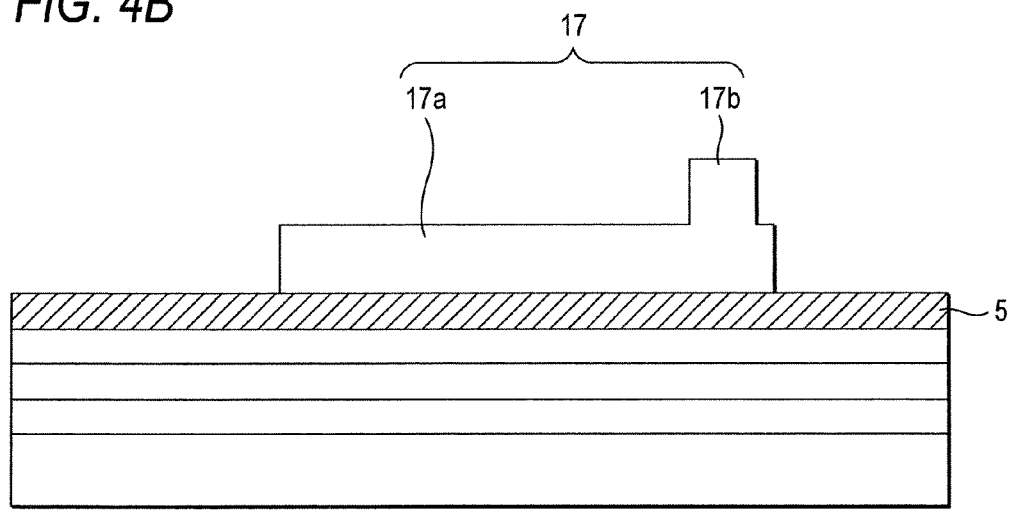

The above processes will be described in detail with reference to FIGS. 4 and 5. FIG. 4A is a step sectional view after the amorphous semiconductor film 16 is formed, and identical with FIG. 3A. Next, an applying process is performed on the conductive film 5, and a developing process is performed after a photoetching process due to half exposure using a known halftone mask, whereby the photoresist 17 such as shown in FIG. 4B is formed. In FIG. 4B, the photoresist 17 includes: a photoresist 17a in a region corresponding to the semiconductor layer 4; and a photoresist 17b in a region corresponding to the storage capacitor 130. The region corresponding to the semiconductor layer 4 means a region where the photoresist 17a required for finally forming the semiconductor layer 4 is formed. It is matter of course that, when shrinkage of a pattern due to process, or the like occurs, a region where such shrinkage or the like is considered is necessary. This is applicable also to the photoresist 17b.

In the embodiment, positive photoresists were used. In the case of a positive photoresist, as the exposure amount is larger, the thickness of the remaining photoresist after a developing process is smaller. In the case of an exposing process for forming the photoresist 17 of the shape shown in FIG. 4B, therefore, the amount of irradiation to a region 17a of the semiconductor layer 4 other than the storage capacitor lower portion 4d is set so as to be larger than that of irradiation to a region 17b corresponding to the storage capacitor lower portion 4d, and smaller than that of irradiation to a region where the semiconductor layer 4 is not formed. In the embodiment, in order that the irradiation amount is adjusted for each exposure portion, the exposing process is performed by using a photomask for half exposure. The photomask has regions where the transmittance amount is differentiated in at least two steps. When such a photomask is used, the exposing process can be performed only one time.

Here, the exposing process may be dividedly performed in an exposing step in which irradiation is performed at a smaller light amount on the region other than the storage capacitor lower portion 4d, and another exposing step in which irradiation is performed at a larger light amount on the region other than the semiconductor layer 4. In this case, two exposing steps are required, but a photomask for half exposure having regions where the transmittance amount is differentiated in at least two steps is not necessary, and the photoresist 17 shown in FIG. 4B can be formed even by using a usual photomask. It is matter of course that, in the case where a negative photoresist is used, the amount relationships of the irradiation amount in the exposing process is inverted.

Figure 4C:
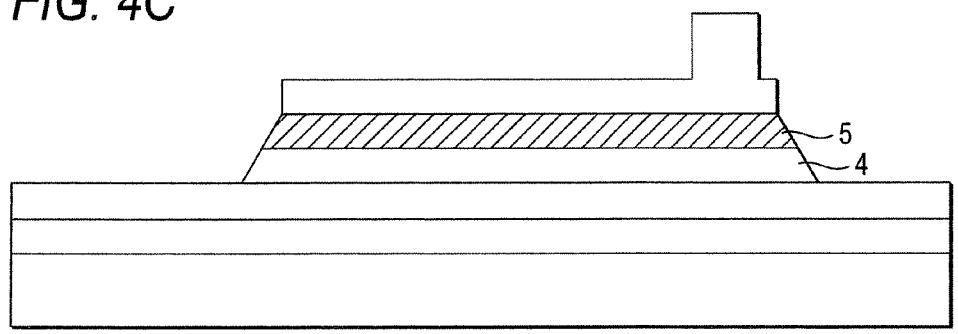

FIG. 4C shows a state where, after the conductive film 5 is etched by using the photoresist 17 shown in FIG. 4B as mask, the amorphous semiconductor film 16 is etched to be formed into the semiconductor layer 4. In the embodiment, a Mo alloy film was used as the conductive film 5, and hence the dry etching method using a mixture gas of $CF_4$ and $O_2$ was performed. Since $O_2$ is mixed in the etching gas, the etching process can be performed while withdrawing a pattern end portion of the photoresist 17. The conductive film 5 and the semiconductor layer 4 are processed to have a structure where a tapered shape is formed in a pattern end portion.

Figure 5A:
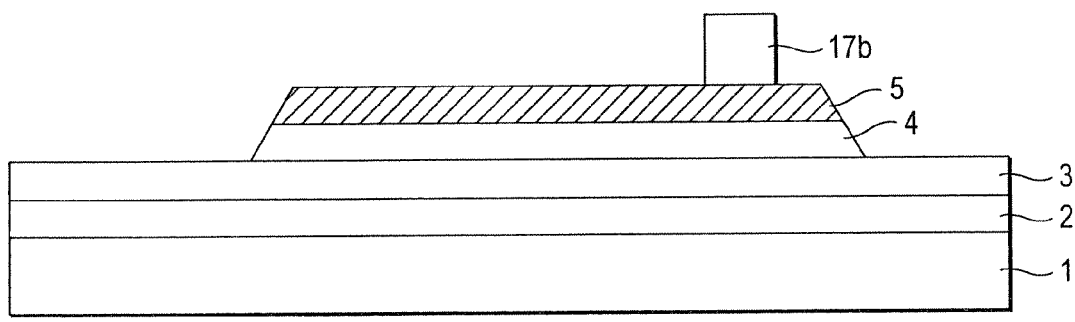
FIG. 5A and FIG. 5B are sectional views of a production step showing the method of producing the TFT and the storage capacitor constituting the display device of Embodiment 1.

Next, referring to FIG. 5A, the thickness of the photoresist 17 is reduced until the photoresist 17b remains only in the region corresponding to the storage capacitor lower portion 4d. In the embodiment, the thickness of the photoresist 17 was uniformly reduced by ashing using an $O_2$ gas. The ashing time may be predetermined, or may be determined by monitoring the luminous phenomenon which is caused when the conductive film 5 is exposed to a plasma of ashing. In the embodiment, the conductive film 5 and the amorphous semiconductor film 16 were etched, and then the thickness of the photoresist 17 was reduced. Alternatively, the two steps may be simultaneously performed. Namely, by performing an etching process in which the thickness of the film to be etched and the etching rate are considered, a direct transfer from the state shown in FIG. 4B to that shown in FIG. 5A may be conducted.

Figure 5B:
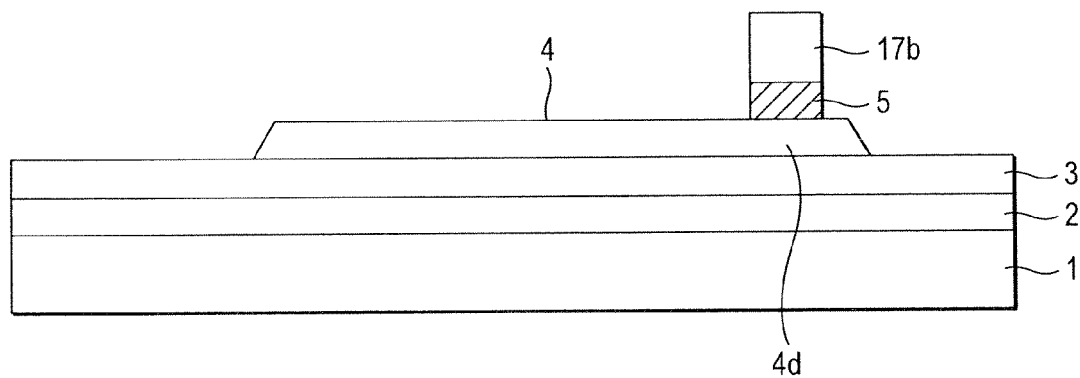

Next, referring to FIG. 5B, the conductive film 5 is etched away with using the photoresist 17b as a mask. An etching process having a selectivity which does not allow the semiconductor layer 4 functioning as the foundation layer to be etched is preferably performed. Alternatively, a reaction layer, which is produced in the interface between the conductive film 5 and the semiconductor layer 4, may be etched away. In the embodiment, a Mo alloy was used as the conductive film 5, and hence the conductive film 5 was etched away by a wet etching method using a chemical solution in which nitric and phosphoric acids are mixed with each other.

As a result of the above steps, the structure shown in FIG. 5B, i.e., the structure in which the pattern of the conductive film 5 is placed at a desired position in that of the semiconductor layer 4 can be obtained by one photoetching step. In other words, the region where the conductive film 5 is formed is within the region where the semiconductor layer 4 is formed. When this structure is employed, the production method can be improved so that the number of photoetching steps can be reduced by one as compared with the case where the conductive film 5 and the amorphous semiconductor film 16 are separately patterned. Therefore, the productivity can be improved.

Figure 6:
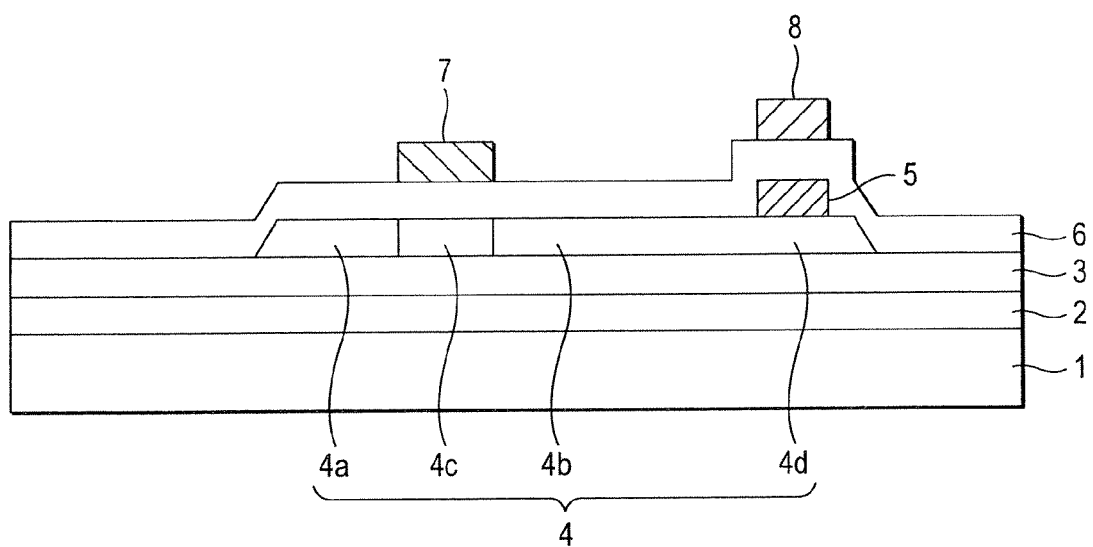
FIG. 6 is a sectional view of a production step showing the method of producing the TFT and the storage capacitor constituting the display device of Embodiment 1.

Next, referring to FIG. 6 which is a step sectional view of the TFT and the storage capacitor, the gate insulating film 6 is formed so as to cover the whole surface of the substrate. Namely, the gate insulating film 6 is grown on the semiconductor layer 4 and the conductive film 5. A SiN film or a $SiO_2$ film is used as the gate insulating film 6. In the embodiment, a $SiO_2$ film is used as the gate insulating film 6, and grown to a thickness of 80 to 100 nm by the CVD method. The surface roughness of the semiconductor layer 4 is set to 3 nm or less, and an end portion of a pattern intersecting with the gate electrode 7 is formed into a tapered shape. Therefore, the gate insulating film 6 has a high covering property, and initial failures can be largely reduced.

Furthermore, a conductive film for forming the gate electrode 7 and the wiring is grown, and then the conductive film is patterned by using a known photoetching process to a desired shape, thereby forming the upper electrode 8 of the storage capacitor, the gate electrode 7, and the gate wirings 121 (see FIG. 1). The upper electrode 8 of the storage capacitor is formed so as to be opposed to the conductive film 5. As the upper electrode 8 of the storage capacitor and the gate electrode 7, Cr, Mo, W, or Ta, or an alloy film essentially containing such a metal can be used. In the embodiment, an alloy film essentially containing Mo was grown to a thickness of 200 to 400 nm by a sputtering method using a DC magnetron. The etching process on the conductive film was performed by a wet etching method using a chemical solution in which nitric and phosphoric acids are mixed with each other.

Next, impurities are introduced into the semiconductor layer 4 via the gate insulating film 6 with using the formed gate electrode 7 as a mask. As the impurity element to be introduced, P or B maybe used. When P is introduced, an n-type TFT can be formed. When the process on the gate electrode 7 is dividedly performed in two steps, a step of forming a gate electrode for an n-type TFT, and that of forming a gate electrode for a p-type TFT, n- and p-type TFTs can be produced on the same substrate so that a CMOS configuration (not shown) can be formed. The introduction of the impurity element of P or B was performed by using the ion doping method. In the ion doping method, a known method in which ion irradiation is performed in the direction perpendicular to the surface of the glass substrate 1 may be used. Alternatively, ion irradiation may be performed in an oblique direction to the surface of the glass substrate.

By the ion doping method, the source region 4a and drain region 4b into which the impurities are introduced are formed as shown in FIG. 6, and also the channel region 4c which is masked by the gate electrode 7, and into which the impurities are not introduced is formed. The conductive film 5 is formed above the storage capacitor lower portion 4d. As described above, the thickness of the conductive film 5 is as small as 25 nm or less. In the case where, for example, there is a protruding region where the conductive film 5 is not covered by the upper electrode 8 of the storage capacitor, therefore, the impurities are introduced also into the storage capacitor lower portion 4d in the region, and an ohmic contact can be obtained between the conductive film 5 and the semiconductor layer 4. Also in the case where such a protruding region does not exist in the conductive film 5, when ion irradiation is performed in an oblique direction, there is a case where the impurities can be introduced into the storage capacitor lower portion 4d while avoiding the upper electrode 8 of the storage capacitor. In this case, the same effects are accomplished.

As a result of the above steps, as shown in FIG. 6, a stacked structure of the gate electrode 7, the gate insulating film 6, and the semiconductor layer 4 is formed in the region where the TFT is formed, and another stacked structure of the upper electrode 8 of the storage capacitor, the gate insulating film 6, the conductive film 5, and the storage capacitor lower portion 4d is formed in the region where the storage capacitor is formed.

Figure 7:
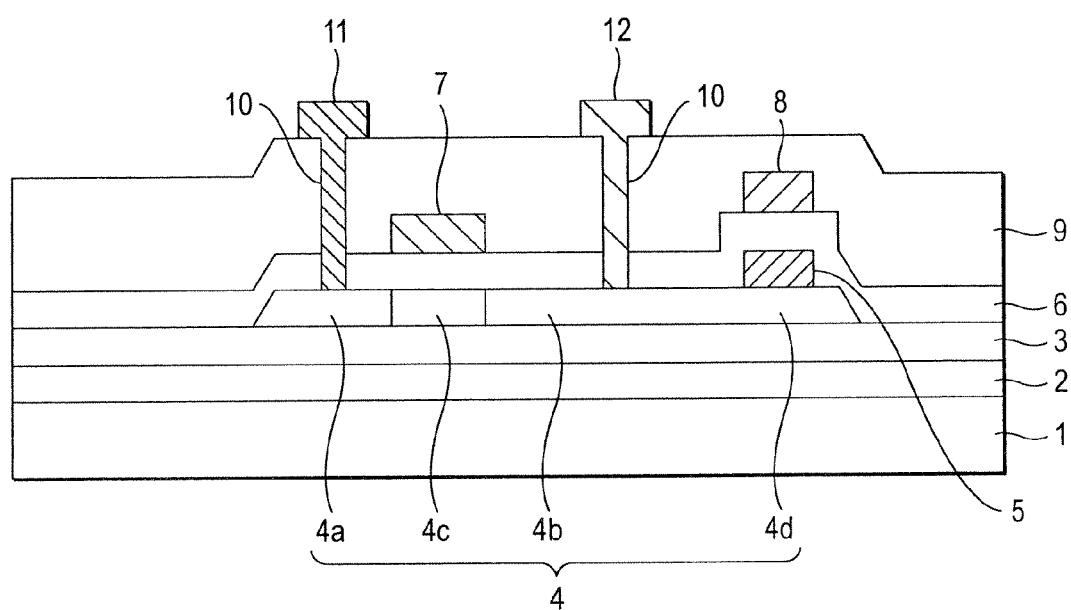
FIG. 7 is a sectional view of a production step showing the method of producing the TFT and the storage capacitor constituting the display device of Embodiment 1.

Next, referring to FIG. 7 which is a step sectional view of the TFT and the storage capacitor in the embodiment, the first interlayer insulating film 9 is grown so as to cover the whole surface of the substrate. The first interlayer insulating film 9 is grown on the gate electrode 7. In the embodiment, a $SiO_2$ film having a thickness of 500 to 700 nm was grown by the CVD method to be formed as the first interlayer insulating film 9. Then, the resulting article was held for about one hour in an annealing oven which was heated to 450° C. in a nitrogen atmosphere. This is performed in order to activate the impurity elements introduced into the source and drain regions 4a, 4b of the semiconductor layer 4. The first interlayer insulating film 9 is not restricted to a $SiO_2$ film, and may be a SiN film or an organic film.

Then, the gate insulating film 6 and first interlayer insulating film 9 which are formed are patterned to a desired shape by using a known photoetching process. In this process, the first contact holes 10, which respectively reach the source and drain regions 4a, 4b of the semiconductor layer 4, are formed. Namely, in the first contact holes 10, the gate insulating film 6 and the first interlayer insulating film 9 are removed away, and the source and drain regions 4a, 4b of the semiconductor layer 4 are exposed. In the embodiment, the etching of the first contact holes 10 was performed by the dry etching method using a mixture gas of $CHF_3$, $O_2$, and Ar.

Next, referring to FIG. 7 which is a step sectional view of the TFT and the storage capacitor in the embodiment, the conductive film is grown on the first interlayer insulating film 9 so as to cover the first contact holes 10, and patterned into a desired shape by using a known photoetching process to form the source electrode 11, the drain electrode 12, and source wiring 122 (see FIG. 1) which are signal lines. As the conductive film in the embodiment, a stacked structure of Mo/Al/Mo, which is formed by continuously growing a Mo film, an Al film, and a Mo film by a sputtering method using a DC magnetron, was used. The thickness of the Al film was 200 to 400 nm, and that of the Mo film was 50 to 150 nm. The etching of the conductive film was performed by a dry etching method using a mixture gas of $SF_6$ and $O_2$ and a mixture gas of $Cl_2$ and Ar. As a result of the above steps, as shown in FIGS. 2 and 7, the source electrode 11 connected to the semiconductor layer 4 is formed on the source region 4a. And, the drain electrode 12 connected to the semiconductor layer 4 is formed on the drain region 4b.

After the series of steps, the TFT 120 and the storage capacitor 130 can be formed. The storage capacitor which is connected in series to the TFT is formed not only on the semiconductor layer 4, but also on the stacked structure in which the conductive film 5 is formed in an upper layer. In this way, the conductive film which has a low resistance is caused to function as the lower electrode of the storage capacitor, whereby a desired voltage can be surely applied to the lower electrode. Therefore, an effect that a stable capacity can be formed is accomplished.

When the thus formed TFT is to be applied to an active matrix display device, a pixel electrode is added to the drain electrode 12. Hereinafter, a description will be made with reference from FIG. 7 to FIG. 2 that is a sectional view showing a status in which a pixel electrode is further formed.

First, the second interlayer insulating film 13 is grown so as to cover the whole surface of the substrate. Namely, the second interlayer insulating film 13 is grown on the source electrode 11 and the drain electrode 12. Thereafter, the second contact hole 14 which reaches the drain electrode 12 is opened in the second interlayer insulating film 13 by using a known photoetching process. In the embodiment, a SiN film having a thickness of 200 to 300 nm was grown by the CVD method to be formed as the second interlayer insulating film 13. The process of opening the second contact hole 14 was performed by a dry etching method using a mixture gas of $CF_4$ and $O_2$.

Next, in order to form the pixel electrode, a conductive film of a transparent material such as ITO or IZO is grown, and then, the conductive film is patterned into a desired shape by using a known photoetching process, thereby forming the pixel electrode 15. In the embodiment, a transparent amorphous conductive film having an excellent workability was grown as the conductive film by a sputtering method using a DC magnetron and a mixture gas of an Ar gas, an $O_2$ gas, and an $H_2O$ gas. In this case, the pixel electrode 15 is patterned so as to be connected to the drain electrode 12 through the second contact hole 14. The etching process on the conductive film was performed by a wet etching method using a chemical solution essentially containing oxalic acid.

Then, an unwanted resist is removed away, and thereafter an annealing process is performed, whereby the pixel electrode 15 configured by a transparent amorphous conductive film is crystallized to complete the TFT substrate 110 which is to be used in the display device. In Embodiment 1, the conductive film was formed only on the semiconductor layer on which the storage capacitor connected in series to the TFT is formed. In this way, the conductive film which has a low resistance is caused to function as the lower electrode of the storage capacitor, whereby a desired voltage can be surely applied to the lower electrode. Therefore, an effect that a stable capacity can be formed is accomplished. When the thus completed TFT substrate 110 is used, a storage capacitor which has no voltage dependency can be formed. Therefore, a display device which has a desired capacitance corresponding to the thickness of the insulating film, and in which less initial failures are caused can be obtained.

Embodiment 2

Figure 8:
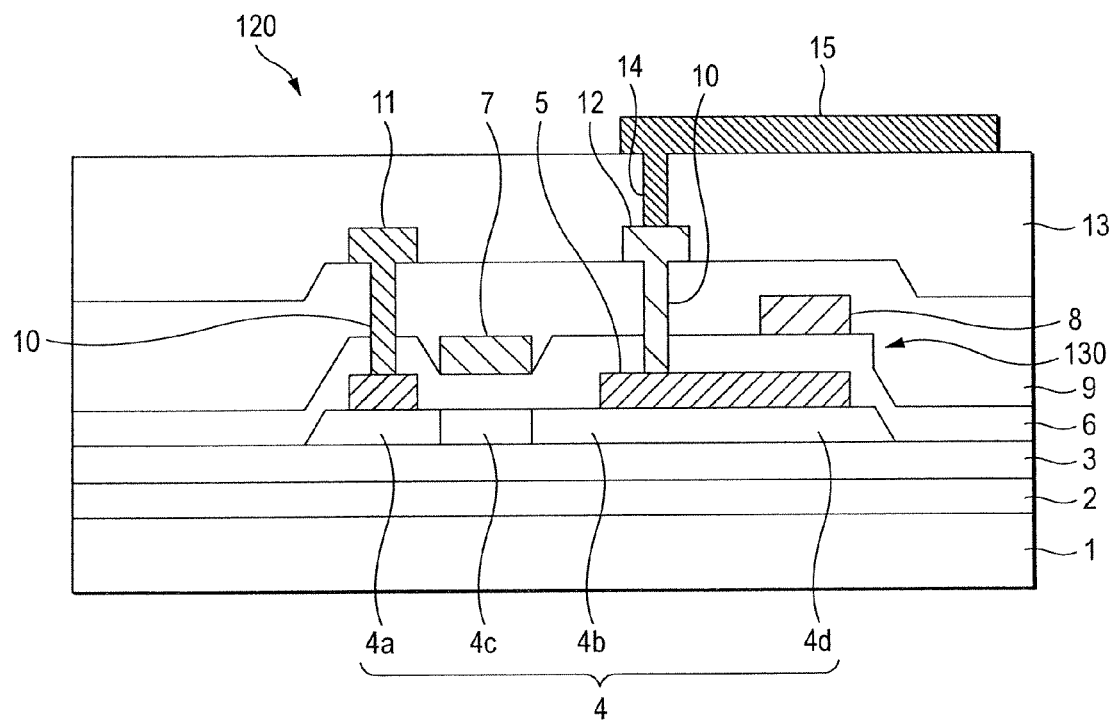
FIG. 8 is a sectional view showing configurations of a TFT and a storage capacitor constituting the display device of Embodiment 2.

In Embodiment 1, the conductive film was formed only on the storage capacitor lower portion which is a semiconductor layer for forming the lower electrode of the storage capacitor. Embodiment 2 is characterized in that the conductive film which is to be formed on the semiconductor layer is formed not only in the storage capacitor, but also in a portion which is contacted to the drain electrode in the drain region, and that which is contacted to the source electrode in the source region. FIG. 8 is a sectional view of the TFT 120 and the storage capacitor 130 in a display device of Embodiment 2.

Referring to FIG. 8, the conductive film 5 is extended from the storage capacitor 130 so as to be formed not only therein, but also on the drain region 4b of the TFT 120. Furthermore, the conductive film is formed also on the source region 4a. Namely, as the conductive film 5, there are not only the conductive film formed as the storage capacitor 130, but also the conductive film 5 formed on the source region 4a, and the conductive film 5 formed on the drain region 4b. According to the structure, in addition to the effects accomplished by Embodiment 1, it is possible to accomplish a further effect that punch-through of the semiconductor layer 4 which easily occurs in the process of opening the first contact holes 10 can be prevented from occurring. When the conductive film 5 is extended from the storage capacitor 130 to the TFT 120, a further effect that the wiring connection resistance between the TFT 120 and the storage capacitor 130 can be reduced is accomplished. When the conductive film 5 is formed by Mo or an alloy film essentially containing Mo, furthermore, deposition of a dry etching gas hardly adheres during a process of forming a contact hole, and therefore it is possible to accomplish an effect that excellent electrical contact characteristics with respect to the source and drain electrodes can be obtained.

The embodiment is different from Embodiment 1 only in that the conductive film 5 is patterned in a different shape, and therefore detailed description about other portion is omitted. The method of using a known halftone mask is identical with that of Embodiment 1 except that the forming region 17b which is thickest in the photoresist 17 is extended from on the storage capacitor lower portion 4d to on the drain region 4b, and formed also on the source region 4a. In Embodiment 2, the thickness of the conductive film 5 is 25 nm or less, and therefore impurities can be introduced into the source region 4a and the drain region 4b by ion doping, even below the conductive film 5.

In FIG. 8, the conductive film 5 is extended from the storage capacitor lower portion 4d to the drain region 4b. However, the extension of the conductive film is not always necessary. Alternatively, the conductive film 5 is formed only on the drain region 4b and the storage capacitor lower portion 4d. Although the effect of reducing the wiring connection resistance between the TFT and the storage capacitor is not accomplished, the effect of preventing punch-through of the semiconductor layer 4 from occurring in the process of opening the first contact holes 10 is accomplished. These effects cause the effect that the display quality of the display device can be improved, to be accomplished.

Embodiment 3

Figure 9:
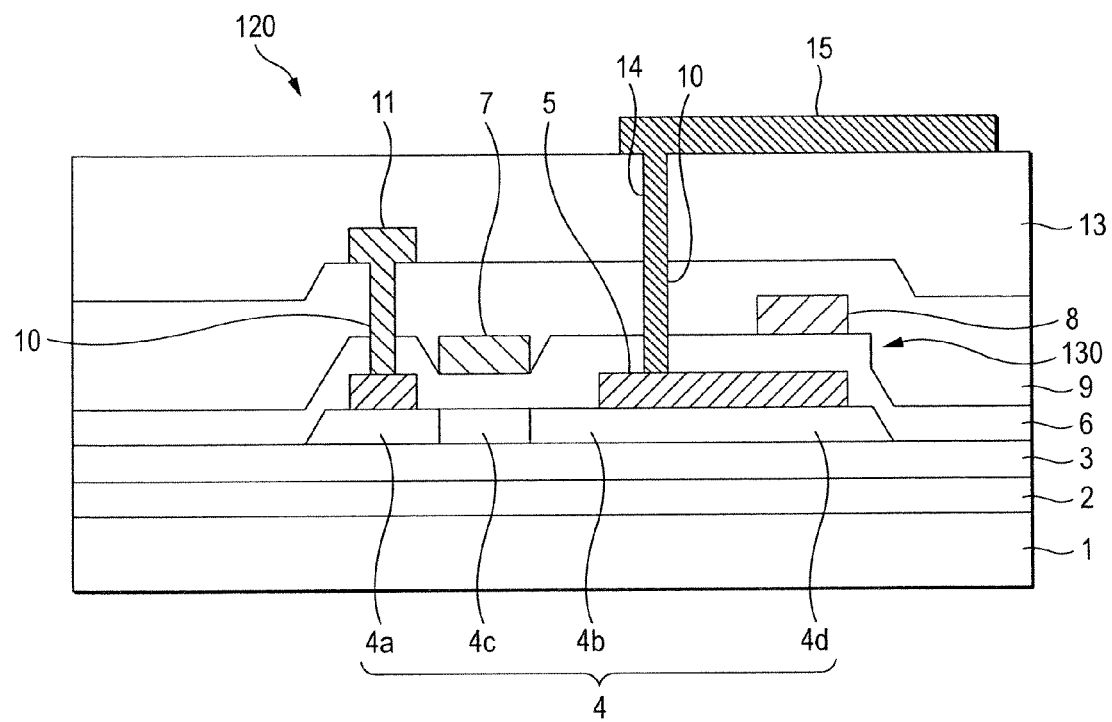
FIG. 9 is a sectional view showing configurations of a TFT and a storage capacitor constituting the display device of Embodiment 3.

FIG. 9 is a sectional view of the TFT 120 and the storage capacitor 130 in the display device of Embodiment 3. Embodiment 3 is different from Embodiments 1 and 2 in that the first contact holes 10 formed in the gate insulating film 6 and the first interlayer insulating film 9, and the second contact hole 14 formed in the second interlayer insulating film 13 are overlappingly formed at a substantially same position, and that the pixel electrode 15 and the conductive film 5 are directly connected to each other without passing through the drain electrode 12. The production method is different only in the existence/nonexistence of the drain electrode 12, and the timing of the formation of the first contact holes 10. In Embodiment 2, the first contact holes 10 are opened after the first interlayer insulating film 9 is formed. By contrast, Embodiment 3 is characterized in that, after the second interlayer insulating film 13 is formed, the second contact hole 14 and the first contact holes 10 are continuously opened, and the pixel electrode 15 which is formed thereafter is directly connected to the conductive film 5 which is formed at least on the drain region 4b, through the second contact hole 14 and the first contact hole 10.

In the conventional structure, when the pixel electrode 15 is formed by a transparent conductive oxide film, and the source/drain regions 4a, 4b are directly contacted to the pixel electrode 15, the semiconductor layer 4 is oxidized in the interface between the transparent conductive oxide film which is the pixel electrode 15 and the semiconductor layer 4. And an insulative oxide is formed in the interface. Therefore, it is difficult to obtain an excellent contact resistance by directly contacting the pixel electrode 15 and the semiconductor layer 4 to each other, and hence they are contacted to each other via the source electrode 11 and drain electrode 12 which are metal films. Also in Embodiment 1, therefore, the semiconductor layer 4 and the pixel electrode 15 are contacted to each other via at least the drain electrode 12. In the TFT structure shown in FIG. 9 in Embodiment 3, the conductive film 5 is formed on the semiconductor layer 4. Even when the connection is done without passing through the drain electrode 12, therefore, the semiconductor layer 4 is not oxidized, and an excellent contact resistance can be obtained.

Embodiment 3 is characterized also in that, because of the structure, the contact hole opening step which affects the connection between the pixel electrode 15 and the conductive film 5 is performed only one time. Usually, a contact hole is opened by using a dry etching method. In this case, the foundation may be damaged in the opening process, and a residue which covers an exposed foundation may be produced, whereby an electrical contact may be impeded. In Embodiment 3 in which the contact hole opening step is performed in a smaller number of times, therefore, it is possible to accomplish an effect that the contact resistance can be further reduced as compared with Embodiments 1 and 2. Similar to Embodiment 2, furthermore, Embodiment 3 accomplishes the effect that punch-through of the semiconductor layer 4 in the contact hole opening step can be prevented from occurring. These effects cause the effect that the display quality of the display device can be improved, to be accomplished.

Embodiment 4

Figure 10:
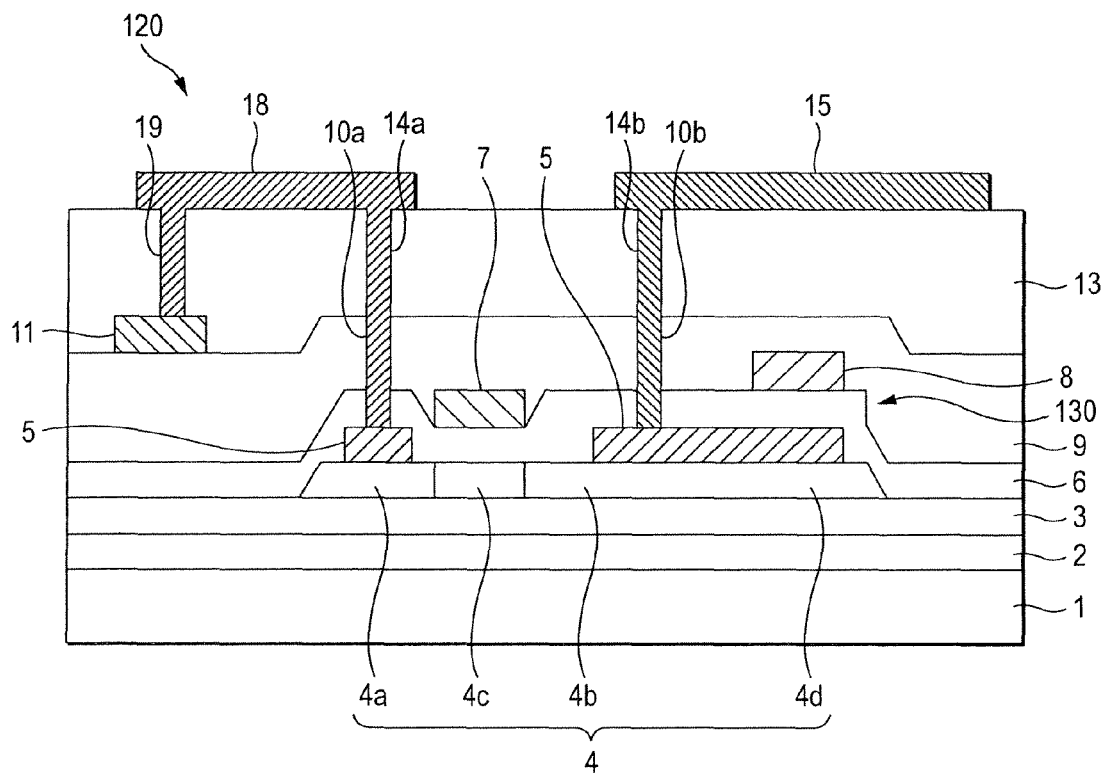
FIG. 10 is a sectional view showing configurations of a TFT and a storage capacitor constituting the display device of Embodiment 4.

FIG. 10 is a sectional view of the TFT 120 and the storage capacitor 130 constituting the display device of Embodiment 4. The polycrystalline semiconductor film 4 serving as the semiconductor layer and configured by polysilicon and the like is formed on the SiN film 2 and the $SiO_2$ film 3 on the glass substrate 1. The semiconductor layer 4 has the source region 4a, the channel region 4c, and the drain region 4b in the TFT 120, and the storage capacitor lower portion 4d in the storage capacitor 130. Impurities are introduced in the source region 4a and the drain region 4b, so that the regions are lower in resistance than the channel region 4c. The conductive film 5 is formed on the storage capacitor lower portion 4d. The stacked structure of the storage capacitor lower portion 4d and the conductive film 5 functions as a lower electrode of the storage capacitor 130. The conductive film 5 is further formed on the source region 4a and the drain region 4b. The gate insulating film 6 made of $SiO_2$ is formed so as to cover the semiconductor layer 4, the conductive film 5, and the $SiO_2$ film 3. The gate electrode 7 is formed on the gate insulating film 6 so as to be opposed to the channel region 4c, and, also in the storage capacitor 130, the upper electrode 8 of the storage capacitor is formed so as to be opposed to the conductive film 5. The storage capacitor 130 is configured by the stacked structure of the storage capacitor lower portion 4d and the conductive film 5, the upper electrode 8 of the storage capacitor, and the gate insulating film 6 functioning as a dielectric insulating film.

The first interlayer insulating film 9 is formed so as to cover the gate electrode 7 and the upper electrode 8 of the storage capacitor, the source electrode 11 is formed on the first interlayer insulating film 9, and the second interlayer insulating film 13 is grown so as to cover them. Second contact holes 14a, 14b are formed in the second interlayer insulating film 13, and first contact holes 10a, 10b are formed in the first interlayer insulating film 9 and the gate insulating film 6. In each of pairs of the first contact hole 10a and the second contact hole 14a, and the first contact hole 10b and the second contact hole 14b, the paired contact holes are overlappingly formed at the same position. The pairs reach the conductive film 5 formed on the source region 4a, and the conductive film 5 formed on the drain region 4b, respectively. A third contact hole 19 is formed in the second interlayer insulating film 13 so as to reach the source electrode 11.

The first contact hole 10a is a contact hole which is opened in the gate insulating film 6 and the first interlayer insulating film 9 so as to open the conductive film 5 formed on the source region 4a, and the first contact hole 10b is a contact hole which is opened in the gate insulating film 6 and the first interlayer insulating film 9 so as to open the conductive film 5 formed on the drain region 4b. The second contact hole 14a is formed in the second interlayer insulating film 13, and overlaps with the first contact hole 10a at the same position, and the second contact hole 14b is formed in the second interlayer insulating film 13, and overlaps with the first contact hole 10b at the same position. The third contact hole 19, and the second contact holes 14a, 14b are similarly formed in the second interlayer insulating film 13. The portions to which the second contact holes 14a, 14b are contacted at their bottoms are the source region 4a and the drain region 4b, or the conductive films 5 formed thereon. By contrast, in the case where a contact hole is connected to the source electrode 11 at the bottom, the contact hole is referred to as the third contact hole 19 in order to distinguish it.

The pixel electrode 15 and connection electrode 18 which are configured by a transparent conductive oxide film or the like are formed on the second interlayer insulating film 13. Similar to Embodiment 3, the pixel electrode 15 is connected to the conductive film 5 formed on the drain region 4b, through the first contact hole 10b and the second contact hole 14b. The connection electrode 18 is connected to the conductive film 5 formed on the source region 4a, through the first contact hole 10a and the second contact hole 14a, and further connected to the source electrode 11 through the third contact hole 19. Through the third contact hole 19, the first contact hole 10a, and the second contact hole 14a, the connection electrode 18 connects the source electrode 11 to the conductive film 5 formed on the source region 4a. Although not illustrated, a voltage is applied through the pixel electrode 15 to an electrooptic material such as a liquid crystal or a self-luminous material, thereby performing a display.

Conventionally, a process must be performed in which the first contact hole 10 is once formed in the first interlayer insulating film 9 and the gate insulating film 6 to form the source electrode 11 and the drain electrode 12, and, after the second interlayer insulating film 13 is formed, a contact hole for connecting the pixel electrode 15 to the drain electrode 12 is formed. In the structure of the TFT of Embodiment 4, the first to third contact holes can be simultaneously patterned, so that the wirings can be connected through the connection electrode 18 which is the same transparent conductive film as the pixel electrode 15. As a result, it is possible to accomplish an effect that the number of photoetching steps can be reduced, and the productivity can be improved. In Embodiment 4, similar to Embodiments 2 and 3, punch-through of the semiconductor layer in the contact hole opening step can be prevented from occurring. Similar to Embodiments 1 to 3, the conductive film which has a low resistance is caused to function as the lower electrode of the storage capacitor, whereby a desired voltage can be surely applied to the lower electrode. Therefore, an effect that a stable capacity can be formed is accomplished. When the thus completed TFT substrate 110 is used, a storage capacitor which has no voltage dependency can be formed. Therefore, a display device which has a desired capacitance corresponding to the thickness of the insulating film, and in which less initial failures are caused can be obtained.

Figure 11:
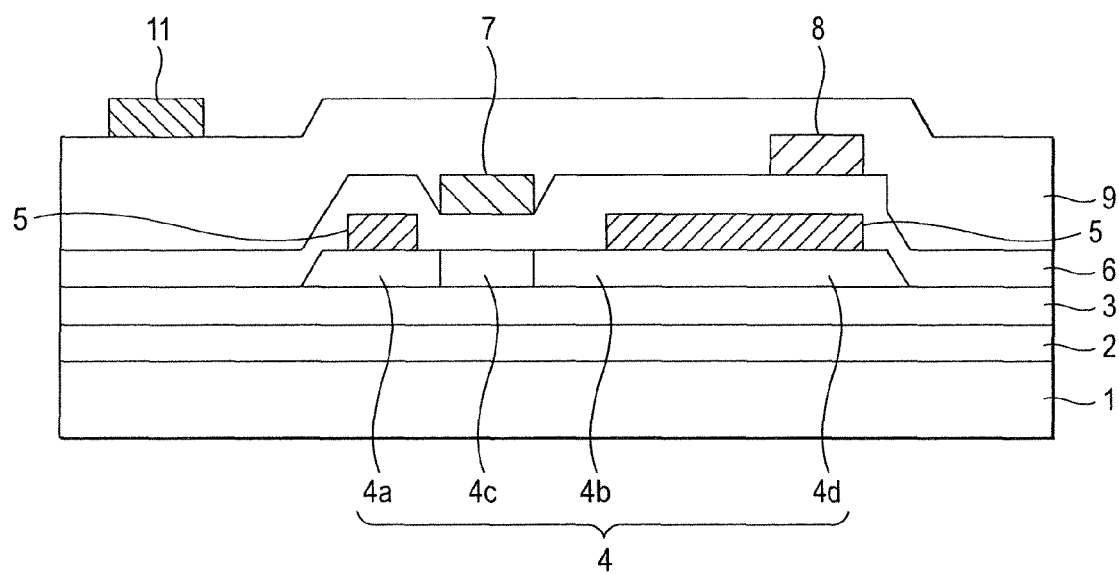
FIG. 11 is a sectional view of a production step showing a method of producing the TFT and the storage capacitor constituting the display device of Embodiment 4.

Next, a method of producing the TFT and storage capacitor of the display device of Embodiment 4 will be described. The steps performed until the first interlayer insulating film 9 is grown are identical with those of Embodiments 2 and 3, and hence their description is omitted. Referring to FIG. 11, after the first interlayer insulating film 9 is grown, the conductive film is grown, and then patterned by using a known photoetching process to a desired shape, thereby forming the source electrode 11 and the source wirings 122 (see FIG. 1). As the conductive film in Embodiment 4, a stacked structure of Mo/Al/Mo, which is formed by continuously growing a Mo film, an Al film, and a Mo film by a sputtering method using a DC magnetron, was used. The thickness of the Al film was 200 to 400 nm, and that of the Mo film was 50 to 150 nm. The etching of the conductive film was performed by a dry etching method using a mixture gas of $SF_6$ and $O_2$ and a mixture gas of $Cl_2$ and Ar. In Embodiment 4, the source electrode 11 is connected only at the upper layer to another wiring. Therefore, the lower Mo layer may be omitted, or a stacked film in which an upper layer is configured by a Mo film and a lower layer is configured by an Al film or an Al alloy film may be used.

Figure 12:
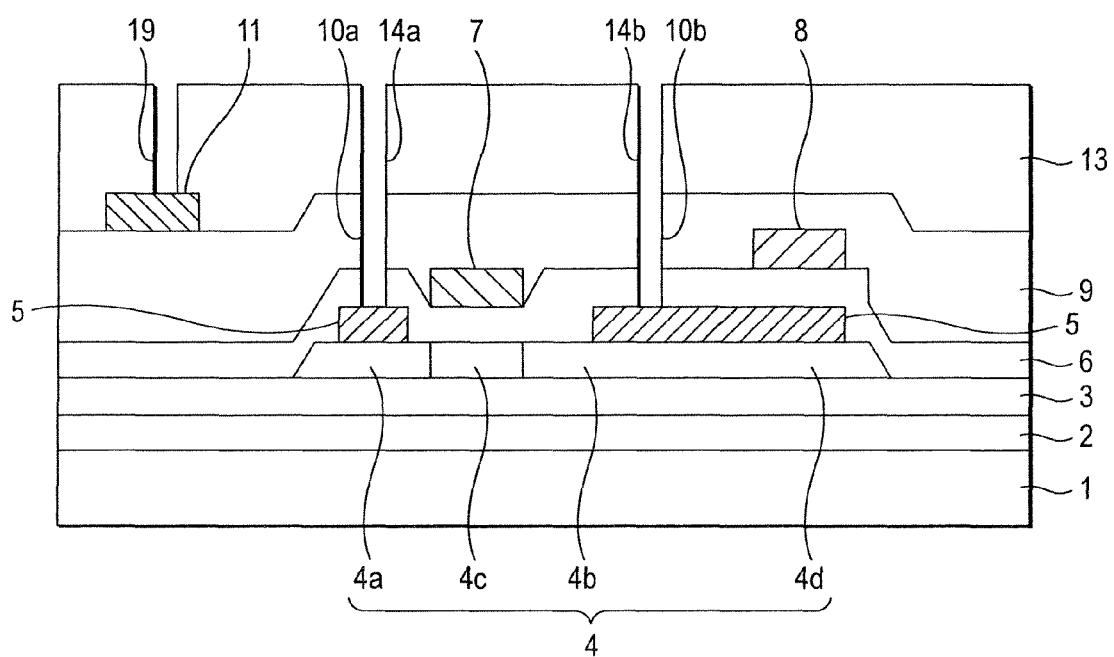
FIG. 12 is a sectional view of a production step showing the method of producing the TFT and the storage capacitor constituting the display device of Embodiment 4.

Next, the second interlayer insulating film 13 is grown so as to cover the whole surface of the substrate. The second interlayer insulating film 13 is grown on the source electrode 11 and the source wiring. Referring to FIG. 12, thereafter, the third contact hole 19 which reaches the source electrode 11 is opened in the second interlayer insulating film 13 by using a photoetching process and etching method which are known. At the same time, the second contact holes 14a, 14b and the first contact holes 10a, 10b are opened in the second interlayer insulating film 13, the first interlayer insulating film 9, and the gate insulating film 6 so as to reach the conductive films 5 formed on the source and drain regions 4a, 4b. In the embodiment, a SiN film having a thickness of 200 to 300 nm was grown by the CVD method to be formed as the second interlayer insulating film 13. The process of opening the first to third contact holes was performed by a dry etching method using a mixture gas of $CF_4$ and $O_2$.

Next, in order to form the pixel electrode 15 and the connection electrode 18, a conductive film of a transparent material such as ITO or IZO is grown, and then patterned into a desired shape by using a known photoetching process, thereby forming the pixel electrode 15 and the connection electrode 18. In the embodiment, the pixel electrode 15 is patterned so as to be connected to the conductive film 5 formed on the drain region 4b, through the first contact hole 10b and the second contact hole 14b. The connection electrode 18 is patterned so as to be connected to the conductive film 5 formed on the source region 4a, through the first contact hole 10a and the second contact hole 14a, and also to the source electrode 11 through the third contract hole 19. In the embodiment, a transparent amorphous conductive film having an excellent workability was grown as the conductive films by a sputtering method using a DC magnetron and a mixture gas of an Ar gas, an $O_2$ gas, and an $H_2O$ gas. The etching process on the conductive films was performed by a wet etching method using a chemical solution essentially containing oxalic acid.

Then, an unwanted resist is removed away, and thereafter an annealing process is performed, whereby the pixel electrode 15 and connection electrode 18 which are configured by a transparent amorphous conductive film are crystallized to complete the TFT substrate 110 which is to be used in the display device. In Embodiment 4, similar to Embodiments 1 to 3, the conductive film is formed on the semiconductor layer which is to form the storage capacitor connected in series to the TFT. In this way, also the conductive film which has a low resistance is caused to function as the lower electrode of the storage capacitor, whereby a desired voltage can be surely applied to the lower electrode. Therefore, an effect that a stable capacity can be formed is accomplished. Similar to Embodiment 2, the conductive film is formed on the drain and source regions, the effect of preventing punch-through of the semiconductor layer from occurring in the process of opening the contact holes is accomplished. Similar to Embodiment 3, the step of opening the contact holes for connecting the pixel electrode to the conductive film formed on the drain region is reduced to one step. Therefore, the effect that the contact resistance can be further reduced can be accomplished. In Embodiment 4, the first to third contact holes can be simultaneously patterned, and the wirings can be connected through the connection electrode, whereby the number of photoetching steps can be reduced. Therefore, it is possible to accomplish an effect that the productivity can be improved.

When the thus completed TFT substrate 110 is used, it is possible to form a storage capacitor which does not depend on the voltage. Therefore, a display device which has a desired capacitance corresponding to the thickness of an insulating film, and in which less initial failures are caused can be obtained. Since the number of photoetching steps is small, it is possible to obtain an economical display device.

What is claimed is:

1. A display device comprising:
a thin film transistor, a pixel electrode, and a storage capacitor on an insulative substrate, wherein:
the thin film transistor comprises a semiconductor layer, a gate insulating film which covers the semiconductor layer, a gate electrode having a region which is opposed to the semiconductor layer via the gate insulating film, and a source electrode which is electrically connected to the semiconductor layer, wherein the pixel electrode is electrically connected to the semiconductor layer; and
wherein the storage capacitor comprises:
a lower electrode having a stacked structure, the stacked structure comprising a semiconductor extension portion which is configured by extension of the semiconductor layer and a conductive film which is formed on and contacts the semiconductor extension portion, and the conductive film is formed on only the semiconductor layer including the semiconductor extension portion;
a dielectric insulating film comprising the gate insulating film; and
an upper electrode of the storage capacitor which is opposed to the lower electrode via the dielectric insulating film.

2. The display device according to claim 1 further comprises:
a conductive film which is formed on a drain region of the semiconductor layer;
a first interlayer insulating film which covers the gate insulating film and the gate electrode;
a first contact hole which is formed in the first interlayer insulating film and the gate insulating film;
a second interlayer insulating film which is formed above the first interlayer insulating film; and
a second contact hole which is formed in the second interlayer insulating film,
wherein the conductive film formed on the drain region is electrically connected to the pixel electrode through the first and second contact holes.

3. The display device according to claim 2 further comprises a drain electrode which is formed above the first interlayer insulating film,
wherein the conductive film formed on the drain region is electrically connected to the drain electrode through the first contact hole, the drain electrode is connected to the pixel electrode through the second contact hole.

4. The display device according to claim 2, wherein the conductive film formed on the drain region is directly connected to the pixel electrode through the first and second contact holes.

5. The display device according to claim 2, further comprising:
a conductive film which is formed on a source region of the semiconductor layer; and
a third contact hole which is formed in the first interlayer insulating film and the gate insulating film,
wherein the source electrode is formed on the first interlayer insulating film, the conductive film formed on the source region is connected to the source electrode through the third contact hole.

6. The display device according to claim 4, further comprising:
a conductive film which is formed on a source region of the semiconductor layer;
said source electrode formed on the first interlayer insulating film;
a third contact hole which is formed in the first interlayer insulating film and the gate insulating film;
a fourth contact hole which is formed in the second interlayer insulating film;
a fifth contact hole which is formed to open the source electrode in the second interlayer insulating film; and
a connection electrode which is connected to the conductive film formed on the source region through the third and fourth contact holes, the connection electrode is connected to the source electrode through the fifth contact hole.

7. The display device according to claim 1, wherein a connection electrode is formed in the same layer as the pixel electrode.

8. The display device according to claim 2, wherein the conductive film is extended from the thin film transistor to the storage capacitor.

9. The display device according to claim 1, wherein the region where the conductive film is formed is within the region where the semiconductor layer is formed.

10. The display device according to claim 9, wherein the conductive film is formed by Mo or an alloy film essentially containing Mo.

11. The display device according to claim 9, wherein the conductive film has a thickness of 25 nm or less.

12. A method of producing a display device according to claim 1, comprising:
forming a polycrystalline semiconductor film on an insulative substrate;
forming a conductive film on the polycrystalline semiconductor film;
applying a resist to the conductive film;
processing the resist so that the resist remains in a region where the semiconductor layer is formed, and forming the resist so that a film thickness of the resist in a region corresponding to the lower portion of the storage capacitor is largest;

after the conductive film which is not covered by the resist is etched, etching the polycrystalline semiconductor film to be processed into the semiconductor layer, and uniformly thinning the resist to remove away the resist in a region other than the region corresponding to the lower portion of the storage capacitor;

removing the conductive film in a region other than the region corresponding to the lower portion of the storage capacitor, to form a stacked structure of the lower portion of the storage capacitor and the conductive film;

removing away the resist;

forming the gate insulating film on the conductive film and the semiconductor layer;

forming the gate electrode and an upper electrode of the storage capacitor, on the gate insulating film so as to be opposed to the semiconductor layer;

forming the source electrode to be connected to the semiconductor layer;

forming the pixel electrode to be connected to the semiconductor layer, and processing the resist so that the resist remains only in a region where the semiconductor layer is formed.

13. The method of claim 12, further comprising:

removing the conductive film from all regions other than the region corresponding to the lower portion of the storage capacitor, to form a stacked structure of the lower portion of the storage capacitor and the conductive film.

* * * * *